United States Patent
Camardello et al.

(10) Patent No.: US 12,195,655 B2
(45) Date of Patent: Jan. 14, 2025

(54) URANIUM-BASED PHOSPHORS AND COMPOSITIONS FOR DISPLAYS AND LIGHTING APPLICATIONS

(71) Applicant: General Electric Company, Schenectady, NY (US)

(72) Inventors: Samuel Joseph Camardello, Ballston Spa, NY (US); Anant A. Setlur, Niskayuna, NY (US); James E. Murphy, Niskayuna, NY (US); Matthew David Butts, Rexford, NY (US)

(73) Assignee: Dolby Intellectual Property Licensing, LLC, Niskayuna, NY (US)

( * ) Notice: Subject to any disclaimer, the term of this patent is extended or adjusted under 35 U.S.C. 154(b) by 0 days.

(21) Appl. No.: 17/966,638

(22) Filed: Oct. 14, 2022

(65) Prior Publication Data

US 2023/0287265 A1    Sep. 14, 2023

Related U.S. Application Data

(63) Continuation of application No. PCT/US2022/024577, filed on Apr. 13, 2022, which
(Continued)

(51) Int. Cl.
  *C09K 11/77* (2006.01)
  *H01L 33/50* (2010.01)

(52) U.S. Cl.
  CPC .......... *C09K 11/771* (2013.01); *H01L 33/502* (2013.01)

(58) Field of Classification Search
  CPC .......................... C09K 11/771; H01L 33/502
(Continued)

(56) References Cited

U.S. PATENT DOCUMENTS

| 3,252,613 A | 5/1966 | Mcgrath |
| 3,457,179 A | 7/1969 | Natansohn |

(Continued)

FOREIGN PATENT DOCUMENTS

| CN | 102220131 A | 10/2011 |
| CN | 113025329 A | 6/2021 |

(Continued)

OTHER PUBLICATIONS

Alekseev, Evgeny V. et al., 'Complex topology of uranyl polyphosphate frameworks: crystalstructures of α-, β-K [(UO2)(P3O9)] and K[(UO2)2(P3O10)].' Z. Anorg. Allg. Chem., Jun. 10, 2008, vol. 634, No. 9, pp. 1527-1532.

(Continued)

*Primary Examiner* — Christopher M Raabe
(74) *Attorney, Agent, or Firm* — Armstrong Teasdale LLP (57) ABSTRACT

A phosphor composition includes an activated uranium-based phosphor having formula I or II. The phosphor is doped with $Eu^{3+}$ $$[Ba_{1-a-b}Sr_aCa_b]_x[Mg,Zn]_y(UO_2)_z([P,V]O_4)_{2(x+y+z)/3} \quad (I)$$

$$[Ba_{1-a-b}Sr_aCa_b]_p(UO_2)_q[P,V]_rO_{(2p+2q+5r)/2} \quad (II)$$

where $0 \leq a \leq 1$, $0 \leq b \leq 1$, $0.75 \leq x \leq 1.25$, $0.75 \leq y \leq 1.25$, $0.75 \leq z \leq 1.25$, $2.5 \leq p \leq 3.5$, $1.75 \leq q \leq 2.25$, and $3.5 \leq r \leq 4.5$ and formula II excludes the combination where a is 0, b is 0, p is 3.5, q is 1.75, and r is 3.5. Phosphor compositions further including formula VI or other luminescent materials, such as quantum dots, devices and displays are also provided.

33 Claims, 5 Drawing Sheets

Related U.S. Application Data is a continuation-in-part of application No. PCT/US2021/027105, filed on Apr. 13, 2021.

(60) Provisional application No. 63/254,021, filed on Oct. 8, 2021.

(58) Field of Classification Search
USPC .................................................. 252/301.6 P
See application file for complete search history.

(56) References Cited

U.S. PATENT DOCUMENTS

| | | | |
|---|---|---|---|
| 3,509,064 | A | 4/1970 | Natansohn |
| 3,576,756 | A | 4/1971 | Russo |
| 3,586,634 | A | 6/1971 | Avella |
| 5,917,935 | A | 6/1999 | Hawthorne et al. |
| 5,953,678 | A | 9/1999 | Genet et al. |
| 7,358,542 | B2 | 4/2008 | Radkov et al. |
| 7,497,973 | B2 | 3/2009 | Radkov et al. |
| 7,648,649 | B2 | 1/2010 | Radkov et al. |
| 7,655,156 | B2 | 2/2010 | Cheng et al. |
| 7,985,723 | B2 | 7/2011 | Savu et al. |
| 8,252,613 | B1 | 8/2012 | Lyons et al. |
| 8,329,485 | B2 | 12/2012 | McKean |
| 8,663,501 | B2 | 3/2014 | Srivastava et al. |
| 8,721,925 | B2 | 5/2014 | Winkler et al. |
| 8,785,222 | B2 | 7/2014 | McKean et al. |
| 8,906,724 | B2 | 12/2014 | Murphy et al. |
| 9,111,464 | B2 | 8/2015 | Bibl et al. |
| 9,222,017 | B2 | 12/2015 | Yoshida |
| 9,388,336 | B2 | 7/2016 | Murphy et al. |
| 9,512,356 | B2 | 12/2016 | Lyons et al. |
| 9,598,636 | B2 | 3/2017 | Kaneyoshi et al. |
| 9,627,437 | B1 | 4/2017 | Ulmer et al. |
| 9,698,314 | B2 | 7/2017 | Murphy et al. |
| 9,879,178 | B2 | 1/2018 | Jin et al. |
| 10,020,430 | B2 | 7/2018 | Nguyen et al. |
| 10,424,614 | B2 | 9/2019 | Schubert et al. |
| 10,600,939 | B2 | 3/2020 | Yuan et al. |
| 10,793,773 | B2 | 10/2020 | Du et al. |
| 2002/0195927 | A1 | 12/2002 | Groen et al. |
| 2003/0148695 | A1 | 8/2003 | Kawamura et al. |
| 2004/0144987 | A1 | 7/2004 | Ouderkirk et al. |
| 2004/0164277 | A1 | 8/2004 | Yen et al. |
| 2006/0012287 | A1 | 1/2006 | Tian et al. |
| 2007/0159060 | A1 | 7/2007 | Shimizu |
| 2008/0111472 | A1 | 5/2008 | Liu et al. |
| 2009/0267485 | A1 | 10/2009 | Nagatomi et al. |
| 2009/0272996 | A1 | 11/2009 | Chakraborty |
| 2010/0142189 | A1 | 6/2010 | Hong et al. |
| 2010/0148193 | A1 | 6/2010 | Duong et al. |
| 2012/0064134 | A1 | 3/2012 | Bourke, Jr. et al. |
| 2012/0256125 | A1 | 10/2012 | Kaneyoshi et al. |
| 2012/0286208 | A1 | 11/2012 | Mckean et al. |
| 2013/0130419 | A1 | 5/2013 | Phipps |
| 2013/0148376 | A1 | 6/2013 | Nick et al. |
| 2013/0335000 | A1 | 12/2013 | Maier |
| 2014/0027673 | A1 | 1/2014 | Nick et al. |
| 2014/0120705 | A1 | 5/2014 | Rogojina |
| 2014/0272657 | A1 | 9/2014 | Milacic et al. |
| 2014/0339495 | A1 | 11/2014 | Bibl et al. |
| 2015/0008463 | A1 | 1/2015 | Yoshida |
| 2015/0076406 | A1 | 3/2015 | Zhou et al. |
| 2015/0301402 | A1 | 10/2015 | Kimura et al. |
| 2015/0329770 | A1 | 11/2015 | Kaneyoshi et al. |
| 2016/0024378 | A1 | 1/2016 | Murphy |
| 2016/0053170 | A1 | 2/2016 | Okura et al. |
| 2016/0244663 | A1 | 8/2016 | Murphy et al. |
| 2016/0289553 | A1 | 10/2016 | Beers et al. |
| 2016/0312114 | A1 | 10/2016 | Murphy et al. |
| 2016/0347998 | A1 | 12/2016 | Kaneyoshi |
| 2017/0073815 | A1 | 3/2017 | Patel et al. |
| 2017/0077360 | A1 | 3/2017 | Yang et al. |
| 2017/0130125 | A1 | 5/2017 | Shibamoto et al. |
| 2017/0153382 | A1 | 6/2017 | Wang et al. |
| 2017/0219184 | A1 | 8/2017 | Petluri |
| 2017/0242303 | A1 | 8/2017 | Meyers |
| 2017/0254943 | A1 | 9/2017 | Murphy |
| 2017/0276997 | A1 | 9/2017 | Yoshinaga |
| 2017/0329770 | A1 | 11/2017 | Kozak et al. |
| 2017/0342278 | A1 | 11/2017 | Zalich et al. |
| 2018/0163126 | A1 | 6/2018 | Murphy et al. |
| 2018/0190827 | A1 | 7/2018 | Okazaki et al. |
| 2018/0208787 | A1 | 7/2018 | Tateishi et al. |
| 2018/0233632 | A1 | 8/2018 | Yuan et al. |
| 2018/0252967 | A1 | 9/2018 | Li et al. |
| 2018/0265778 | A1 | 9/2018 | Du et al. |
| 2019/0018273 | A1 | 1/2019 | Park et al. |
| 2019/0088827 | A1 | 3/2019 | Camardello et al. |
| 2019/0179016 | A1 | 6/2019 | Raring et al. |
| 2019/0280165 | A1 | 9/2019 | Camardello et al. |
| 2019/0292448 | A1 | 9/2019 | Porob et al. |
| 2019/0366847 | A1 | 12/2019 | Meyers |
| 2020/0028033 | A1 | 1/2020 | Camardello et al. |
| 2020/0287099 | A1 | 9/2020 | Camardello et al. |
| 2020/0299574 | A1 | 9/2020 | Hashizume |
| 2020/0301261 | A1 | 9/2020 | Hashizume |
| 2020/0304764 | A1 | 9/2020 | Hashizume |
| 2020/0369956 | A1 | 11/2020 | Butts et al. |
| 2023/0246013 | A1* | 8/2023 | Murphy ............... G09G 3/3406 257/79 |

FOREIGN PATENT DOCUMENTS

| | | |
|---|---|---|
| DE | 2523933 A1 | 12/1976 |
| GB | 1174380 A | 12/1969 |
| JP | 2003336045 A | 11/2003 |
| JP | 5375733 B2 | 12/2013 |
| JP | 5884717 B2 | 3/2016 |
| KR | 20010004094 A | 1/2001 |
| KR | 20120095629 A | 8/2012 |
| TW | 200930793 A | 7/2009 |
| TW | 201727336 A | 8/2017 |
| TW | 201921731 A | 6/2019 |
| WO | 2010074963 A1 | 7/2010 |
| WO | 2013121355 A1 | 8/2013 |
| WO | 2014146748 A1 | 9/2014 |
| WO | 2016186637 A1 | 11/2016 |
| WO | 2017073815 A1 | 5/2017 |
| WO | 2018093832 A2 | 5/2018 |
| WO | 2018185116 A2 | 10/2018 |
| WO | 2018190827 A1 | 10/2018 |
| WO | 2019173025 A1 | 9/2019 |
| WO | 2021211600 A1 | 10/2021 |

OTHER PUBLICATIONS

Allpress "The crystal structure of caesium uranyl oxychloride Csx(UO2)OClx (x approximately 0.9)", Published 1964 in "Acta Crystallographica", 17, 41-46 (Year: 1964).

Anonymous, "Compreignactie", (Aug. 11, 2016), pp. 1-3, fluomin, URL: http://www.fluomin.org/uk/fiche.php?id=1008, XP055738271.

Anonymous, "Renardite", (Aug. 12, 2016), pp. 1-2, fluomin, URL: http://www.fluomin.org/uk/fiche.php?id=868&name=renardite, XP055738269.

Anonymous, "Dumontite", (Aug. 12, 2016), pp. 1-2, fluomin, URL: http://www.fluomin.org/uk/fiche.php?id=325, XP055738275.

Anonymous, "Sodium-zippeite", (Aug. 11, 2016), pp. 1-3, fluomin, URL: http://www.fluomin.org/uk/fiche.php?id=674, XP055738273.

Braun, David D. et al., "Rheology Modifiers Handbook: Practical Use and Application", Part 2, pp. 71-191, Elsevier, 2013 (ISBN:0-8155-1441-7).

Cai, Xing-Wei et al., "Lead-free/rare earth-free Green-light-emitting crystal based on organic-inorganic hybrid [(C10H16N)2][MnBr4] with high emissive quantum yields and large crystal size", Journal of Molecular Structure, vol. 1161, 2018, pp. 262-266, ISSN 0022-2860, https://doi.org/10.1016/j.molstruc.2018.01.093.

Chukanov et al., "Chistyakovaite, a new mineral Al(UO2)2(AsO4)2(F,OH)—6.5H2O", Doklady Earth Sciences, (Feb. 28, 2006), vol. 407, No. 2, ISSN 1531-8354, pp. 290-293, XP019316270.

(56) References Cited

OTHER PUBLICATIONS

Chukanov et al., "Larisaite, Na(H3O)(UO2)3(SeO3)2O2—4H2O, a new uranyl selenite mineral from Repete mine, San Juan County, Utah, USA", European Journal of Mineralogy, (Jan. 1, 2004), vol. 16, No. 2, doi:10.1127/0935-1221/2004/0016-0367, ISSN 0935-1221, pp. 367-374, XP055738278.

Derby, Brian, "Inkjet Printing Ceramics: From Drops to Solid", 2011, Journal of the European Ceramic Society—J Eur Ceram Soc, 31, 2543-2550, 10.1016/j.jeurceramsoc.2011.01.016.

Gong, Liaokuo et al., "Efficient modulation of photoluminescence by hydrogen bonding interactions among inorganic [MnBr4]2− anions and organic cations", 2019, Chemical Communications, 55 (51), 10.1039/C9CC03038G.

Gough et al., "Multi-Photon Phosphor Feasibility Research", Advanced Light Source Development U.S. Dept. of Energy Contract with EPRI: DE-FC26-00NT40987 Reporting Period Oct. 1, 2000 to Mar. 31, 2002; Final Report, May 2003.

Huang et al., "Highly stable K2SiF6: Mn4+K2SiF6 composite phosphor with narrow red emission for white LEDs.", ACS applied materials & interfaces, 2018, vol. 10, No. 21, pp. 18082-18092, <doi:10.1021/acsami.8b03893>.

International Search Report and Written Opinion for International Application No. PCT/US2022/024577, dated Aug. 3, 2022, 9 pages.

International Search Report and Written Opinion of the International Searching Authority, PCT/US2019/017606, May 27, 2019.

International Search Report and Written Opinion of the International Searching Authority, PCT/US2020/028946, Aug. 10, 2020.

International Search Report and Written Opinion of the International Searching Authority, PCT/US2021/013963, May 12, 2021.

International Search Report and Written Opinion of the International Searching Authority, PCT/US2021/027105 dated Jul. 30, 2021.

International Search Report and Written Opinion of the International Searching, Authority, dated Dec. 21, 2021 for International Application No. PCT/US2021/048535.

Kikuyama et al., Surface Active Buffered Hydrogen Fluoride Having Excellent Wettability for ULSI Processing, IEEE Transactions on Semiconductor Manufacturing, vol. 3, No. 3, Aug. 1990, pp. 99-108.

Kumar et al., "On the photo and thermally stimulated luminescence properties of U doped SrBPO5", Materials Research Bulletin, vol. 60, Dec. 2014, 7 Pages.

Lee, Ernest et al., "Quantum Dot Conversion Layers Through Inkjet Printing", Nanosys, Inc., Milpitas, CA, May 21, 2018, 4 pages.

Liu, Yuanyuan et al., "Experimental study of the parameters for stable drop-on-demand inkjet performance", Physics of Fluids, 31, 032004 (2019) https://doi.org/10.1063/1.5085868.

M. V. Hoffman, "Fluorescence and Energy Transfer in SrZnP2 07. UO2", J. Electrochem. Soc.: Solid State Science, Feb. 1970, No. 2, vol. 117, 6 Pages.

Mao, Wenhui et al., "Synthesis, crystal structure, photoluminescence properties of organic-inorganic hybrid materials based on ethylenediamine bromide", Journal of Saudi Chemical Society, vol. 24, Issue 1, 2020, pp. 52-60, ISSN 1319-6103, https://doi.org/10.1016/j.jscs.2019.09.003.

Mikolajek, Morten et al., "Requirements to Ceramic Suspensions for Inkjet Printing", 2015, Ceramic Forum International, 92, E25-29.

Morad, Viktoriia et al., "Manganese(II) in Tetrahedral Halide Environment: Factors Governing Bright Green Luminescence", Chemistry of Materials, 2019, 31 (24), 10161-10169, DOI: 10.1021/acs.chemmater.9b03782.

Morrison et al., "Flux versus Hydrothermal Growth: Polymorphism of A2(UO2)Si2O6 (A=Rb, Cs)", Inorganic chemistry, 2017, vol. 56, pp. 1053-1056.

Nguyen et al., "Waterproof Alkyl Phosphate Coated Fluoride Phosphors for Optoelectronic Materials", Angewandte Communications, International Edition vol. 54, 2015, pp. 10865-10866.

Nichols et al., "Fluorescence of the Uranyl Salts", Published in 1919 by the Carnegie Institution of Washington (Year: 1919).

Non-final Office Action dated May 12, 2021 for related U.S. Appl. No. 17/152,751.

Onac et al., "Hydrothermal Genesis of Metatyuyamunite, Ca(UO2)2(VO4)2•3-5H2O in the Valea Rea Cave, Romania", 13th International Congress of Speleology 4th Speleological Congress of Latin América and Caribbean 26th Brazilian Congress of Speleology, (Ju. 22, 2001), pp. 25-30, XP055637609.

Ondruě et al., "Cejkaite, the triclinic polymorph of Na4(UO2)(CO3)3—A new mineral from Jachymov, Czech Republic", American Mineralogist, (Apr. 31, 2003), vol. 88, No. 4, doi:10.2138/am-2003-0422, ISSN 0003-004X, pp. 686-693, XP055637612.

Pekov et al., "Beshtauite, (NH4)2(UO2)(SO4)2 . 2H2O, a new mineral from Mount Beshtau, Northern Caucasus, Russia", American Mineralogist, (Aug. 31, 2014), vol. 99, No. 8-9, doi:10.2138/am.2014.4870OLITCiteNPL, ISSN 0003-004X, pp. 1783-1787, XP009523386.

Phosphor Film—Contribute to High Efficiency and Thinner Liquid Crystal Display with Backlight Using Mini LED, White Paper for PS Series, dated Sep. 2022.

Plasil et al., "Adolfpateraite, K(UO2)(SO4)(OH)(H2O), a new uranyl sulphate mineral from Jachymov", American Mineralogist, Czech Republic, (2012), vol. 97, No. 2-3, doi: 10.2138/am.2012.3976, pp. 447-454, XP009523379.

Pote et al., "Preparation of CaF2: U Phosphor by Solid State Metathesis Reaction", International Journal of Self-Propagating High-Temperature Synthesis, 2013, vol. 22, No. 1, pp. 37-40.

Pro Display XDR Technology Overview, White Paper, dated Feb. 2020.

Qin, Yanyan et al., "Luminescent manganese(II) complexes: Synthesis, properties and optoelectronic applications", Coordination Chemistry Reviews, vol. 416, 2020, 213331, ISSN 0010-8545, https://doi.org/10.1016/j.ccr.2020.213331.

Rabinowitch, "Spectroscopy and Photochemistry of Uranyl Compounds", Published Jan. 1, 1964, 1st Edition, The MacMillian Company, New York, pp. 47, 57, & 58 (Year: 1964).

Read et al., "Crystal growth, structural characterization, cation-cation interaction classification, and optical properties of uranium(VI) containing oxychlorides, A4U5O16Cl2 (A=K, Rb), Cs5U7O22Cl3, and AUO3Cl (A=Rb, Cs)", Published Apr. 7, 2014 in "CrystEngComm", 2014, 16, 7259-7267.

Read, Cory Michael, "Discovery of novel uranium-containing oxides and related materials by flux crystal growth", University of South Carolina 2015, pp. 1-258.

Rout et al., "Uranium speciation and its site occupancy in alkaline-earth borophosphates", Journal of the American Ceramic Society, vol. 100, No. 7, Apr. 3, 2017 (Apr. 3, 2017), pp. 2921-2931, XP055810229, ISSN: 0002-7820, DOI: 10.1111/jace.14800, Retrieved from the internet: URL: https://api.wiley.com/onlinelibrary/tdm/v1/articles/10.1111%2Fjace.14800>.

"Sijbom et al., "K_2SiF_6:Mn4+ as a red phosphor for displays and warm-white LEDs: a review of properties and perspectives", Optical Materials Express, vol. 7, No. 9, Aug. 24, 2017 (Aug. 24, 2017), pp. 3332-3365, XP055810315, DOI: DirectPDFAccess/32562ED4-D5B4-A705-8BEB3A3D3B44F39F_371019/0me-7-9-3332.pdf?da=1&id=371019&seq=0&mobile=no>".

Slattery, "Uranium as an Activator-II", Published in 1929 by Journal of the Optical Society of America, vol. 19, Issue 4, pp. 175-186 (Year: 1929).

Taikar et al., "SrO: U6+ green light emitting phosphor", Journal of Luminescence, Elsevier, Science direct, 153, 2014, pp. 304-306.

Worku, Michael et al., "Sunlike White-Light-Emitting Diodes Based on Zero-Dimensional Organic Metal Halide Hybrids", ACS Applied Materials & Interfaces, 2018, 10 (36), 30051-30057, DOI: 10.1021/acsami.8b12474.

Wu, Yuying et al., "New photoluminescence hybrid perovskites with ultrahigh photoluminescence quantum yield and ultrahigh thermostability temperature up to 600 K", Nano Energy, vol. 77, 2020, 105170, ISSN 2211-2855, https://doi.org/10.1016/j.nanoen.2020.105170.

(56) References Cited

OTHER PUBLICATIONS

Zhou, Tingting et al., "P-92: Fabrication and Patterning of a Wide-Color-Gamut Color Filter Based on Quantum Dots", 2016, SID Symposium Digest of Technical Papers, 47, 1469-1471, 10.1002/sdtp.10945.

PCT International Search Report, Application No. PCT/US2022/024577, dated Aug. 3, 2022, 5 pages.

G. Blasse et al., "Luminescence of Barium Uranyl Phosphate", J. Inorg. Nucl. Chem., vol. 40, Jun. 1, 1978, pp. 2037-2039.

Ziyang Hou et al., "A Green synthetic route to the highly efficient K2SiF6 Mn4+ narrow-band red phosphor for warm white light-emitting diodes", Journal of Materials Chemistry, 2018, 8 pages.

Douglas Naab et al., "GE K2SiF6:Mn4+ (PFS/KSF) Phosphor: Market Leading Wide Color Gamut Technology & Path Towards Enabling Next Generation Displays", 2019, 13 pages.

Ji Hye Oh et al., "Analysis of wide color gamut of green/red bilayered freestanding phosphor film-capped white LEDs for LCD backlight", Optical Society of America, vol. 23, No. 15, Jul. 17, 2015, 14 pages.

R. F. Vochten et al., "Transformation of chernikovite into meta-uranocircite II, Ba(UO2)2(PO4)2•6H2O and study of its solubility", Mineralogical Magazine, Sep. 1992, vol. 56, pp. 367-372.

EP Third Party Submission, Publication No. Application No. 20210788285, dated Nov. 20, 2023, 5 pps.

PCT International Search Report, Application No. PCT/US2022/077858, dated Feb. 7, 2023, 13 pages.

Shijun Wu et al., High Distorted Uranyl Ion Coordination and One/Two-Dimensional Structural Relationship in the Ba2[UO2(TO4)2] (T=P, As) System: An Experimental and Computational Study, Inorganic Chemistry, Jul. 3, 2014, vol. 53, pp. 7650-7660.

\* cited by examiner

URANIUM-BASED PHOSPHORS AND COMPOSITIONS FOR DISPLAYS AND LIGHTING APPLICATIONS

CROSS-REFERENCE TO RELATED APPLICATIONS

This application is a continuation of copending International Application No. PCT/US2022/024577 filed Apr. 13, 2022, which claims the benefit of priority to U.S. Provisional Patent Application No. 63/254,021, filed Oct. 8, 2021, entitled "Uranium-based Phosphors and Compositions for Displays and Lighting Applications", and is a continuation-in-part of International Application No. PCT/US2021/027105 filed Apr. 13, 2021, each of which is incorporated by reference in its entirety herein.

BACKGROUND

The field of the invention relates generally to phosphor materials and devices, and more particularly to Uranium-based phosphor materials useful for display applications and lighting applications.

General lighting is based on human eye sensitivity to visible radiation and on the solar spectra. The effect of eye sensitivity relates to the total lumen output, while the match to full spectra of solar radiation creates the color rendering index (CRI). Traditional types of general lighting include incandescent lighting and fluorescent lighting. LED lighting provides increased efficacy, a 40% reduction in electricity use and an extended average life over traditional general lighting. LED lighting can cover a nearly continuous range across the visible wavelengths of about 380 nm to about 750 nm and can be used for general lighting applications and display applications. The tunability of LED lighting can be used to create both a full spectrum (high CRI) and high efficacy (lumens/watt) lighting based on the desired properties and phosphor combinations used. LED lighting also creates the ability to have human centric lighting, that will subtly change color throughout the day, and specialty lighting for applications such as plant growth.

White light can be generated by employing a near-ultraviolet (UV) or blue emitting LED in conjunction with an inorganic phosphor or a blend of inorganic phosphors, such as red-emitting phosphors and green or yellow-green emitting phosphors. The total emission from the phosphor and the LED chip provides a color point with corresponding color coordinates (x and y on the 1931 CIE chromaticity diagram) and correlated color temperature (CCT), and its spectral distribution provides a color rendering capability, measured by the color rendering index (CRI) based on a scale of 100. Efficacy is the measurement of the amount of light emitted per power used (lumens/watt) with higher amounts preferred. Narrow band red-emitting phosphors based on complex fluoride materials activated by $Mn^{4+}$ are described in U.S. Pat. Nos. 7,358,542, 7,497,973, and 7,648,649. These complex fluorides can be utilized in combination with yellow-green emitting phosphors such as cerium-doped yttrium aluminum garnet $Y_3Al_5O_{12}:Ce^{3+}$ (YAG) or other garnet compositions to achieve warm white light (CCTs<5000 K on the blackbody locus, color rendering index (CRI>80)) from a blue LED, with high efficacy. High efficiency with a variety of emissions from the phosphor materials is also desired.

Current display device technology relies on liquid crystal displays (LCDs), which is one of the most widely used flat panel displays for industrial and residential applications. Next-generation devices will have low energy consumption, compact size, and high brightness, requiring larger color gamut coverage. Smaller LEDs, such as mini-LEDs or micro-LEDs, will be needed for next-generation devices. Mini-LEDs have a size of about 100 μm to 0.7 mm. For micro-LEDs, the displays may be self-emissive or include miniaturized backlighting arrayed with individual LEDs smaller than 100 μm. When these next-gen micro-LED displays are self-emissive and require a color conversion layer, very thin layers or films of phosphor material with high absorption coefficients are needed.

BRIEF DESCRIPTION

In one aspect, a phosphor composition includes an activated uranium-based phosphor having formula I or II. The phosphor is doped with $Eu^{3+}$ $$[Ba_{1-a-b}Sr_aCa_b]_x[Mg,Zn]_y(UO_2)_z([P,V]O_4)_{2(x+y+z)/3} \quad (I)$$

$$[Ba_{1-a-b}Sr_aCa_b]_p(UO_2)_q[P,V]_rO_{(2p+2q+5r)/2} \quad (II)$$

where $0 \le a \le 1$, $0 \le b \le 1$, $0.75 \le x \le 1.25$, $0.75 \le y \le 1.25$, $0.75 \le z \le 1.25$, $2.5 \le p \le 3.5$, $1.75 \le q \le 2.25$, and $3.5 \le r \le 4.5$ and formula II excludes the combination where a is 0, b is 0, p is 3.5, q is 1.75, and r is 3.5.

In another aspect, the phosphor composition includes a red phosphor having formula VI:

$$A_x(MF_y):Mn^{4+} \quad VI$$

where A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7.

In one embodiment, the phosphor compositions may include other luminescent materials, such as additional phosphors, phosphorescent dyes, color filter pigments, polyfluorenes, metal oxide nanoparticles and quantum dot material. In another embodiment, the phosphor composition can also include scattering particles.

In another embodiment, a device is provided. The device includes an LED light source radiationally connected and/or optically coupled to a phosphor composition including an activated uranium-based phosphor. In one embodiment, the phosphor has formula I and is doped with $Eu^{3+}$. In another embodiment, the phosphor has formula II and is doped with $Eu^{3+}$. Formula II excludes the combination where a is 0, b is 0, p is 3.5, q is 1.75, and r is 3.5.

Another aspect is a lighting apparatus including the device. Yet another aspect is a backlight apparatus including the device. In other aspects, display applications include the device are provided. In another embodiment, a device for horticulture lighting is provided.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. All references are incorporated herein by reference.

As used herein, the terms "comprises," "comprising," "includes," "including," "has," "having," "contains", "containing," "characterized by" or any other variation thereof, are intended to cover a non-exclusive inclusion, subject to any limitation explicitly indicated. For example, a composition, mixture, process or method that comprises a list of elements is not necessarily limited to only those elements but may include other elements not expressly listed or inherent to such composition, mixture, process or method.

The transitional phrase "consisting of" excludes any element, step, or ingredient not specified. If in the claim, such would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition or method that includes materials, steps, features, components, or elements, in addition to those literally disclosed, provided that these additional materials, steps, features, components, or elements do not materially affect the basic and novel characteristic(s) of the claimed disclosure. The term "consisting essentially of" occupies a middle ground between "comprising" and "consisting of".

Where a disclosure or a portion thereof is defined with an open-ended term such as "comprising," it should be readily understood that (unless otherwise stated) the description should be interpreted to also describe such a disclosure using the terms "consisting essentially of" or "consisting of".

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Square brackets in the formulas indicate that at least one of the elements within the brackets is present in the phosphor material, and any combination of two or more thereof may be present, as limited by the stoichiometry of the composition. For example, the formula $[Ca,Sr,Ba]_3MgSi_2O_8:Eu^{2+}$, $Mn^{2+}$ encompasses at least one of Ca, Sr or Ba or any combination of two or more of Ca, Sr or Ba. Examples include $Ca_3MgSi_2O_8:Eu^{2+},Mn^{2+}$; $Sr_3MgSi_2O_8:Eu^{2+},Mn^{2+}$; or $Ba_3MgSi_2O_8:Eu^{2+},Mn^{2+}$. Formula with an activator after a colon ":" indicates that the phosphor composition is doped with the activator. Formula showing more than one activator separated by a "," after a colon ":" indicates that the phosphor composition is doped with either activator or both activators. For example, the formula $[Ca,Sr,Ba]_3MgSi_2O_8:Eu^{2+},Mn^{2+}$ encompasses $[Ca,Sr,Ba]_3MgSi_2O_8:Eu^{2+}$, $[Ca,Sr,Ba]_3MgSi_2O_8:Mn^{2+}$ or $[Ca,Sr,Ba]_3MgSi_2O_8:Eu^{2+}$ and $Mn^{2+}$.

The uranium-based phosphor materials of the present disclosure provide a narrow band green emission and, in some cases, provide good energy transfer with good quantum efficiency. These phosphors can be used for a variety of LED based lighting and display applications. The pure green emission on its own can be used in displays to provide high gamut and to fill in the teal gap for human centric lighting. The efficient energy transfer of these materials to ions like $Eu^{3+}$, makes them spectrally better-suited to provide high efficacy lighting (lumens/watt) because they are spectrally blue-shifted vs other commercially available phosphors to have a greater overlap with the human eye sensitivity and can be used in phosphor blends to produce lighting apparatus with high efficacy and CRI values.

The activator ion $Eu^{3+}$, also provide emission spectra for specialty high CRI lighting and lighting for plant growth. In some embodiments, europium can be sensitized with the uranium-based phosphor to provide a narrow emission spectra in the red/far-red region (about 600 nm to about 800 nm), which is desirable for horticultural lighting. In some embodiments, horticulture lighting includes LED-based white lighting with a composition including a uranium-based phosphor, which can be used for indoor lighting and outdoor lighting for plant growth. In other embodiments, the horticulture lighting includes phosphor packages including uranium-based phosphors. In some embodiments, the horticulture lighting may be solar-based.

The phosphors doped with $Eu^{3+}$, have tunable emission spectra based on the amount of activator ion added to the host compositions. This spectral tuning leads to the ability to make a phosphor for display applications that can have both a green and red emission peak to produce wide gamut displays; this is especially useful for film-based displays where the Mura of the film is important in the final application. Instead of having to ensure that multiple phosphors are evenly dispersed in a film, there would only be the need to have one phosphor evenly dispersed because it supplies both green and red emission.

The inventors discovered that uranium-based phosphor materials of the present disclosure can produce an energy transfer with good quantum efficiency when the uranyl ion is used as a sensitizer to activator ions, such as Europium. This was surprising, as others have tried to sensitize Europium emission for use in LEDs for years, but all previous attempts have been unsuccessful with very minimal energy transfer or quantum efficiencies too low to be useful in final applications.

The luminescence of Europium, shows that the emission can be used for lighting applications to obtain general lighting with high efficacy (Lms/W), which is not obtainable with commercial market phosphor solutions. The pure uranium emission spectra of the phosphor materials can absorb at 450 nm and fill in the teal gap, which leads to a full spectra in general lighting and higher CRI values. The pure uranium spectra can be used for display backlight applications to provide a high gamut.

The phosphors of the present disclosure may be characterized as uranium-doped or U-doped because the $U^{6+}$ ions are part of the emitting species. The term 'U-doped' typically indicates that a relatively small number of uranium atoms is substituted in the host lattice. In many compounds the uranium is present in the host lattice as the uranyl ion $(UO_2)^{2+}$. Because the uranyl ion is characterized by linear O—U—O bonding, there is typically an upper limit to the substitution that can be achieved, on the order of a few mole percent with respect to the site on which it is substituted. When substituting for a $M^{2+}$ ion there are size constraints between the $M^{2+}$ and the $(UO_2)^{2+}$ center that may create host lattice strain and/or compensating defects in the host lattice. As a result, concentration quenching of the $U^{6+}$ emission usually occurs before full substitution is achieved. In contrast, the phosphors of the present disclosure contain the $UO_2$ species as part of the host lattice and comprise uranyl ions at a concentration as high as about 40 mole % relative to the total number of moles of $M^{2+}$ cations present.

The phosphor material is doped with activator ions, such as lanthanide ions having luminescent properties. The inventors discovered that uranium-based phosphor material co-doped with lanthanide activator ions, such as $Eu^{3+}$, showed an efficient energy transfer from the green pure uranium emission spectra. This was surprising as other ions in the lanthanide series did not exhibit an energy transfer or good quantum efficiency. A small number of the activator ions are incorporated into the host lattice of the compound.

In some embodiments, the phosphor materials may include activator ions in an amount of from about 0.001 to about 10 mole percent. In another embodiment, the activator ions may be present in an amount of from about 0.01 mole percent to about 10 mole percent. In another embodiment, the activator ion may be present in an amount from about 0.1 mole percent to about 10 mole percent. In another embodiment, the activator ion may be present in an amount from about 0.5 to about 5 mole percent. In another embodiment, the activators may be present from about 1 to about 3 mole percent. In another embodiment, the activator ion may be present from about 0.01 mole percent to about 1 mole percent. In another embodiment, the activator ion may be present from about 0.05 mole percent to about 1 mole percent. In another embodiment, the activator ion may be present from about 0.1 mole percent to about 1 mole percent. In another embodiment, the activator ion may be present from about 0.5 mole percent to about 1 mole percent.

In one embodiment, an activated uranium-based phosphor includes
(i) a phosphor having formula I:

$$[Ba_{1-a-b}Sr_aCa_b]_x[Mg,Zn]_y(UO_2)_z([P,V]O_4)_{2(x+y+z)/3} \qquad (I)$$

where the phosphor is doped with $Eu^{3+}$, and where $0 \le a \le 1$, $0 \le b \le 1$, $0.75 \le x \le 1.25$, $0.75 \le y \le 1.25$, and $0.75 \le z \le 1.25$; or (ii) a phosphor having formula II, $$[Ba_{1-a-b}Sr_aCa_b]_p(UO_2)_q[P,V]_rO_{(2p+2q+5r)/2} \qquad (II),$$

where the phosphor is doped with $Eu^{3+}$, and where $0 \le a \le 1$, $0 \le b \le 1$, $0.75 \le x \le 1.25$, $0.75 \le y \le 1.25$, $0.75 \le z \le 1.25$, $2.5 \le p \le 3.5$, $1.75 \le q \le 2.25$, and $3.5 \le r \le 4.5$; and formula II excludes the combination where a is 0, b is 0, p is 3.5, q is 1.75, and r is 3.5.

In some embodiments, the uranium-based phosphors have formula I:

$$[Ba_{1-a-b}Sr_aCa_b]_x[Mg,Zn]_y(UO_2)_z([P,V]O_4)_{2(x+y+z)/3} \qquad I$$

where $0 \le a \le 1$, $0 \le b \le 1$, $0.75 \le x \le 1.25$, $0.75 \le y \le 1.25$, $0.75 \le z \le 1.25$. In some embodiments, one or more activator ions may be present, such as $Eu^{3+}$. Particular examples include $Ba[Mg, Zn]UO_2(PO_4)_2$, and more particularly, $BaMgUO_2(PO_4)_2$ and $BaZnUO_2(PO_4)_2$.

In some embodiments, the uranium-based phosphors have formula II:

$$[Ba_{1-a-b}Sr_aCa_b]_p(UO_2)_q[P,V]_rO_{(2p+2q+5r)/2} \qquad II$$

where $0 \le a \le 1$, $0 \le b \le 1$, $2.5 \le p \le 3.5$, $1.75 \le q \le 2.25$, and $3.5 \le r \le 4.5$. Formula II excludes the combination where a is 0, b is 0, p is 3.5, q is 1.75, and r is 3.5. In some embodiments, the uranium-based phosphors have formula IIA:

$$[Ba,Sr,Ca,Mg,Zn]_p(UO_2)_q[P,V]_rO_{(2p+2q+5r)/2} \qquad IIA$$

For formula IIA, compounds $Ba_2UO_2(PO_4)_2$ and $\gamma\text{-}Ba_2UO_2(PO_4)_2$ are excluded. In some embodiments, one or more activator ions may be present for formula II or IIA, such as $Eu^{3+}$. Particular examples include $Ba_3(PO_4)_2(UO_2)_2P_2O_7$ and $Ba_3(PO_4)_2(UO_2)_2V_2O_7$.

An energy transfer from the uranium ion to the activator ion can be measured by a change in color coordinate values, ccx and ccy (x and y on the 1931 CIE chromaticity diagram. In some embodiments, the activated phosphor exhibits a ccx value change by at least 15% and a ccy value by at least 10%. In some embodiments, the activated phosphor exhibits a ccx value change of at least 25%. In another embodiment, the activated phosphor exhibits a ccx value change of at least 50%. In some embodiments, the activated phosphor exhibits a ccx value change from about 15% to about 200%. In another embodiment, the ccx value change is from about 25% to about 200% and in another embodiment, the ccx value change is from about 50% to about 200%. In some embodiments, the activated phosphor exhibits a ccy value change of at least 10%. In another embodiment, the activated phosphor exhibits a ccy value change from about 10% to about 50%.

The inventors found that the uranium-based phosphor materials co-doped with activator ions, such as $Eu^{3+}$, were color tunable, that is the ratio of the green emission from the uranium to the emission color of the activator ion could be adjusted depending on the ratio of the activator ion. In some embodiments, the phosphor emission may be shifted so that it is spectrally closer to the eye sensitivity range centered at 555 nm. These activator ions can be used in lighting applications to provide a higher intensity in human centric lighting and high efficacy (Lms/W) lighting that is not currently available in commercial market phosphor solutions.

In some embodiments, the uranium-based phosphor materials may be used for high efficacy general lighting. In other embodiments, the uranium-based phosphor materials may be color-tuned to reduce hazardous blue light emission for use in eye-safe displays. In other embodiments, the uranium-based phosphor materials may be color-tuned to produce emission suitable for plant growth. In other embodiments, the uranium-based phosphor may be color tuned to produce a high gamut display with the green and red emission produced from a single phosphor.

In another aspect, a phosphor composition includes an activated uranium-based phosphor including (i) a phosphor having formula I:

$$[Ba_{1-a-b}Sr_aCa_b]_x[Mg,Zn]_y(UO_2)_z([P,V]O_4)_{2(x+y+z)/3} \quad (I)$$

where the phosphor is doped with $Eu^{3+}$, and where $0 \leq a \leq 1$, $0 \leq b \leq 1$, $0.75 \leq x \leq 1.25$, $0.75 \leq y \leq 1.25$, and $0.75 \leq z \leq 1.25$; or (ii) a phosphor having formula II, $$[Ba_{1-a-b}Sr_aCa_b]_p(UO_2)_q[P,V]_rO_{(2p+2q+5r)/2} \quad (II),$$

where the phosphor is doped with $Eu^{3+}$, where $0 \leq a \leq 1$, $0 \leq b \leq 1$, $0.75 \leq x \leq 1.25$, $0.75 \leq y \leq 1.25$, $0.75 \leq z \leq 1.25$, $2.5 \leq p \leq 3.5$, $1.75 \leq q \leq 2.25$, and $3.5 \leq r \leq 4.5$; and formula II excludes the combination where a is 0, b is 0, p is 3.5, q is 1.75, and r is 3.5.

In one embodiment, the uranium-based phosphors may include $Ba_3(PO_4)_2(UO_2)_2P_2O_7$, $BaZnUO_2(PO_4)_2$, $BaMgUO_2(PO_4)_2$. The phosphors emit bright green and can provide a large gamut for display applications.

The uranium-based phosphor materials of the present disclosure may be produced by firing a mixture of precursors under an oxidizing atmosphere. Non-limiting examples of suitable precursors include the appropriate metal oxides, hydroxides, alkoxides, carbonates, nitrates, aluminates, silicates, citrates, oxalates, carboxylates, tartarates, stearates, nitrites, peroxides, phosphates, pyrophosphates, alkali salts and combinations thereof. Suitable materials for use as precursors include, but are not limited to, $BaCO_3$, $BaHPO_4$, $Ba_3(PO_4)_2$, $Ba_2P_2O_7$, $Ba_2Zn(PO_4)_2$, $BaZnP_2O_7$, $Ba(OH)_2$, $Ba(C_2O_4)$, $Ba(C_2H_3O_2)_2$, $Ba_3(C_6H_5O_7)_2$, $Ba(NO_3)_2$, $CaCO_3$, $HUO_2PO_4 \cdot 4H_2O$, $KH_2PO_4$, $K_2CO_3$, $Mg(C_2O_4)$, $Mg(C_2H_3O_2)_2$, $Mg(C_6H_6O_7)$, $MgCO_3$, $MgO$, $Mg(OH)_2$, $Mg_3(PO_4)_2$, $Mg_2P_2O_7$, $Mg_2Ba(PO_4)_2$, $MgHPO_4$, $Mg(NO_3)_2$, $NaH_2PO_4$, $Na_2CO_3$, $NH_4MgPO_4$, $(NH_4)_2HPO_4$, $NH_4VO_3$, $SrCO_3$, $Zn(C_2O_4)$, $Zn(C_2H_3O_2)_2$, $Zn_3(C_6H_5O_7)_2$, $ZnCO_3$, $ZnO$, $Zn(OH)_2$, $Zn_3(PO_4)_2$, $Zn_2P_2O_7$, $Zn_2Ba(PO_4)_2$, $ZnHPO_4$, $Zn(NO_3)_2$, $NH_4ZnPO_4$, $UO_2$, $UO_2(NO_3)_2$, $(UO_2)_2P_2O_7$, $(UO_2)_3(PO_4)_2$, $NH_4(UO_2)PO_4$, $UO_2CO_3$, $UO_2(C_2H_3O_2)_2$, $UO_2(C_2O_4)$, $H(UO_2)PO_4$, $UO_2(OH)_2$, and $ZnUO_2(C_2H_3O_2)_4$, and various hydrates. For example, the exemplary phosphor $BaZnUO_2(PO_4)_2$ may be produced by mixing the appropriate amounts of $BaCO_3$, $ZnO$, and $UO_2$ with the appropriate amount of $(NH_4)_2HPO_4$ and then firing the mixture under an air atmosphere. The precursors may be in solid form or in solution. Non-limiting examples of solvents include water, ethanol, acetone, and isopropanol, and suitability depends chiefly on solubility of the precursors in the solvent. After firing, the phosphor may be milled to break up any agglomerates that may have formed during the firing procedure.

The mixture of starting materials for producing the phosphor includes, but is not limited to, activator precursor oxide compounds, such as $Eu_2O_3$ and precursor phosphate compounds, such as $EuPO_4$.

The mixture of starting materials for producing the phosphor may also include one or more low melting temperature flux materials, such as boric acid, borate compounds such as lithium tetraborate, alkali phosphates, and combinations thereof. Non-limiting examples include $(NH_4)_2HPO_4$ (DAP). $Li_3PO_4$, $Na_3PO_4$, $NaBO_3$—$H_2O$, $Li_2B_4O_7$, $K_4P_2O_7$, $Na_4P_2O_7$, $H_3BO_3$, and $B_2O_3$. The flux may lower the firing temperature and/or firing time for the phosphor. If a flux is used, it may be desirable to wash the final phosphor product with a suitable solvent to remove any residual soluble impurities that may have originated from the flux.

The firing of the samples is generally done in air, but since the uranium is in its highest oxidation state ($U^{6+}$) it can also be fired in $O_2$ or other wet or dry oxidizing atmospheres, including at oxygen partial pressures above one atmosphere, at a temperature between about 500° C. and about 1300° C., particularly between about 500° C. and about 1200° C., for a time sufficient to convert the mixture to the phosphor. The firing time required may range from about one to twenty hours, depending on the amount of the mixture being fired, the extent of contact between the solid and the gas of the atmosphere, and the degree of mixing while the mixture is fired or heated. The mixture may rapidly be brought to and held at the final temperature, or the mixture may be heated to the final temperature at a lower rate such as from about 2° C./minute to about 200° C./minute.

In one embodiment, the phosphor composition may include, in addition to the uranium-based phosphor material, one or more other luminescent materials. Additional luminescent materials, such as blue, yellow, red, orange, or other color phosphors may be used in the phosphor composition to customize the white color of the resulting light and produce specific spectral power distributions.

Suitable phosphors for use in the phosphor composition, include, but are not limited to: $((Sr_{1-z}[Ca,Ba,Mg,Zn]_z)_{1-(x+w)}[Li,Na,K,Rb]_wCe_x)_3(Al_{1-y}Si_y)O_{4+y+3(x-w)}F_{1-y-3(x-w)}$, $0 \leq x \leq 0.10$, $0 \leq y \leq 0.5$, $0 \leq z \leq 0.5$, $0 \leq w \leq x$; $[Ca,Ce]_3Sc_2Si_3O_{12}$ (CaSiG); $[Sr,Ca,Ba]_3Al_{1-x}Si_xO_{4+x}F_{1-x}$:$Ce^{3+}$ (SASOF)); $[Ba,Sr,Ca]_5(PO_4)_3[Cl,F,Br,OH]$:$Eu^{2+}$,$Mn^{2+}$; $[Ba,Sr,Ca]BPO_5$:$Eu^{2+}$,$Mn^{2+}$; $[Sr,Ca]_{10}(PO_4)_6 \ast vB_2O_3$:$Eu^{2+}$ (wherein $0 \leq v \leq 1$); $Sr_2Si_3O_8 \ast 2SrCl_2$:$Eu^{2+}$; $[Ca,Sr,Ba]_3MgSi_2O_8$:$Eu^{2+}$,$Mn^{2+}$; $BaAl_8O_{13}$:$Eu^{2+}$; $2SrO \ast 0.84P_2O_5 \ast 0.16B_2O_3$:$Eu^{2+}$; $[Ba,Sr,Ca]MgAl_{10}O_{17}$:$Eu^{2+}$,$Mn^{2+}$; $[Ba,Sr,Ca]Al_2O_4$:$Eu^{2+}$; $[Y,Gd,Lu,Sc,La]BO_3$:$Ce^{3+}$,$Tb^{3+}$; $ZnS$:$Cu^+$,$Cl^-$; $ZnS$:$Cu^+$,$Al^{3+}$; $ZnS$:$Ag^+$,$Cl^-$; $ZnS$:$Ag^+$,$Al_3+$; $[Ba,Sr,Ca]_2Si_{1-n}O_{4-2n}$:$Eu^{2+}$ (wherein $0 \leq n \leq 0.2$); $[Ba,Sr,Ca]_2[Mg,Zn]Si_2O_7$:$Eu^{2+}$; $[Sr,Ca,Ba][Al,Ga,In]_2S_4$:$Eu^{2+}$; $[Y,Gd,Tb,La,Sm,Pr,Lu]_3[Al,Ga]_{5-a}O_{12-3/2a}$:$Ce^{3+}$ (wherein $0 \leq a \leq 0.5$); $[Ca,Sr]_8[Mg,Zn](SiO_4)_4Cl_2$:$Eu^{2+}$,$Mn^{2+}$; $Na_2Gd_2B_2O_7$:$Ce^{3+}$,$Tb^{3+}$; $[Sr,Ca,Ba,Mg,Zn]_2P_2O_7$:$Eu^{2+}$,$Mn^{2+}$; $[Gd,Y,Lu,La]_2O_3$:$Eu^{3+}$,$Bi_{3+}$; $[Gd,Y,Lu,La]_2O_2S$:$Eu^{3+}$,$Bi^{3+}$; $[Gd,Y,Lu,La]VO_4$:$Eu^{3+}$,$Bi^{3+}$; $[Ca,Sr,Mg]S$:$Eu^{2+}$,$Ce^{3+}$; $SrY_2S_4$:$Eu^{2+}$; $CaLa_2S_4$:$Ce^{3+}$; $[Ba,Sr,Ca]MgP_2O_7$:$Eu^{2+}$,$Mn^{2+}$; $[Y,Lu]_2WO_6$:$Eu^{3+}$,$Mo^{6+}$; $[Ba,Sr,Ca]_bSi_gN_m$:$Eu^{2+}$ (wherein $2b+4g=3$ m); $Ca_3(SiO_4)Cl_2$:$Eu^{2+}$; $[Lu,Sc,Y,Tb]_{2-u-v}Ce_vCa_{1+u}Li_wMg_{2-w}Pw[Si,Ge]_{3-w}O_{12-u/2}$ (where $0.5 \leq u \leq 1$, $0 \leq v \leq 0.1$, and $0 \leq w \leq 0.2$); $[Y,Lu,Gd]_{2-m}$ $[Y,Lu,Gd]Ca_mSi_4N_{6+m}$:$C_{1-m}$:$Ce^{3+}$, (wherein $0 \leq m \leq 0.5$); $[Lu,Ca,Li,Mg,Y]$, alpha-SiAlON doped with $Eu^{2+}$ and/or $Ce^{3+}$; $Sr(LiAl_3N_4)$:$Eu^{2+}$, $[Ca,Sr,Ba]SiO_2N_2$:$Eu^{2+}$,$Ce^{3+}$; beta-SiAlON:$Eu^{2+}$; $3.5MgO \ast 0.5MgF_2 \ast GeO_2$:$Mn^{4+}$; $Ca_{1-c-f}Ce_cEu_fAl_{1-c}N_3$, (where $0 \leq c \leq 0.2$, $0 \leq f \leq 0.2$); $Ca_{1-h-r}Ce_hEu_rAl_{1-h}(Mg,Zn)_hSiN_3$, (where $0 \leq h \leq 0.2$, $0 \leq r \leq 0.2$); $Ca_{1-2s-t}Ce_s[Li,Na]_sEu_tAlSiN_3$, (where $0 \leq s \leq 0.2$, $0 \leq t \leq 0.2$, $s+t>0$); $[Sr, Ca]AlSiN_3$: and $Eu^{2+}$,$Ce^{3+}$, $Li_2CaSiO_4$:$Eu^{2+}$.

In one embodiment, an additional luminescent material may be a red emitting phosphor of formula VI:

$$A_xMF_y:Mn^{4+} \quad (VI),$$

where A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7.

The red emitting phosphor of formula is radiationally and/or optically coupled to the LED light source. The phosphors of formula I are described in U.S. Pat. Nos.

7,497,973, and 8,906,724, and related patents assigned to the General Electric Company. Examples of the red emitting phosphors of formula VI include, $K_2(TiF_6):Mn^{4+}$, $K_2(SnF_6):Mn^{4+}$, $Cs_2(TiF_6):Mn^{4+}$, $Rb_2(TiF_6):Mn^{4+}$, $Cs_2(SiF_6):Mn^{4+}$, $Rb_2(SiF_6):Mn^{4+}$, $Na_2(SiF_6):Mn^{4+}$, $Na_2(TiF_6):Mn^{4+}$, $Na_2(ZrF_6):Mn^{4+}$, $K_3(ZrF_7):Mn^{4+}$, $K_3(BiF_7):Mn^{4+}$, $K_3(YF_7):Mn^{4+}$, $K_3(LaF_7):Mn^{4+}$, $K_3(GdF_7):Mn^{4+}$, $K_3(NbF_7):Mn^{4+}$ or $K_3(TaF_7):Mn^{4+}$. In certain embodiments, the phosphor of formula VI is $K_2SiF_6:Mn^{4+}$.

In one embodiment, the red-emitting phosphor has a Mn loading or Mn % of at least 1 wt %. In another embodiment, the red-emitting phosphor has a Mn loading of at least 1.5 wt %. In another embodiment, the red-emitting phosphor has a Mn loading of at least 2 wt %. In another embodiment, the red-emitting phosphor has a Mn % of at least 3 wt %. In another embodiment the Mn % is greater than 3.0 wt %. In another embodiment, the content of Mn in the red-emitting phosphor is from about 1 wt % to about 4 wt %.

In one embodiment, the red-emitting phosphors based on complex fluoride materials activated by $Mn^{4+}$ phosphors may be at least partially coated with surface coatings to enhance stability of the phosphor particles and resist aggregation by modifying the surface of the particles and increase the zeta potential of the particles. In one embodiment, the surface coatings may be a metal fluoride, silica or organic coating. In one embodiment, the red-emitting phosphors based on complex fluoride materials activated by $Mn^{4+}$ phosphors are at least partially coated with a metal fluoride, which increases positive Zeta potential and reduces agglomeration. In one embodiment, the metal fluoride coating includes $MgF_2$, $CaF_2$, $SrF_2$, $BaF_2$, $AgF$, $ZnF_2$, $AlF_3$ or a combination thereof. In another embodiment, the metal fluoride coating is in an amount from about 0.1 wt % to about 10 wt %. In another embodiment, the metal fluoride coating is present in an amount from about 0.1 wt % to about 5 wt %. In another embodiment, the metal fluoride coating is present from about 0.3 wt % to about 3 wt %. Metal fluoride coated red-emitting phosphors based on complex fluoride materials activated by $Mn^{4+}$ are prepared as described in WO 2018/093832 and US Publication No. 2020/0369956. The entire contents of each of which are incorporated herein by reference.

In one embodiment, the red-emitting phosphors based on complex fluoride materials activated by $Mn^{4+}$ phosphors are at least partially coated with an organic coating, such as polymerized oleic acid. Oleic acid may be used to coat the phosphor particles via a solvothermal synthesis or treatment, such as by a mixing adsorption treatment.

In particular embodiments, additional phosphors include: $[Ba,Sr,Ca]_2SiO_4:Eu^{2+}$, $[Y,Gd,Lu,Tb]_3[Al,Ga]_5O_{12}:Ce^{3+}$, β-SiAlON:$Eu^{2+}$, $[Sr,Ca,Ba][Ga,Al]_2S_4:Eu^{2+}$, [Li,Ca]α-SiAlON:$Eu^{2+}$, $[Ba,Sr,Ca]_2Si_5N_8:Eu^{2+}$, $[Ca,Sr]AlSiN_3:Eu^{2+}$, $[Ba,Sr,C]LiAl_3N_4:Eu^{2+}$, $[Sr,Ca,Mg]S:Eu^{2+}$, $[Ba,Sr,Ca]_2Si_2O_4:Eu^{2+}$ and $K_2SiF_6:Mn^{4+}$.

Other additional luminescent materials suitable for use in the phosphor composition may include electroluminescent polymers such as polyfluorenes, preferably poly(9,9-dioctyl fluorene) and copolymers thereof, such as poly(9,9'-dioctylfluorene-co-bis-N,N-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, a quantum dot material, or a combination thereof. Materials suitable for use as the phosphorescent dye include, but are not limited to, tris(1-phenylisoquinoline) iridium (III) (red dye), tris(2-phenylpyridine) iridium (green dye) and iridium (III) bis(2-(4,6-difluorophenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE. Exemplary quantum dot materials are based on CdSe, ZnS or InP, including, but not limited to, core/shell luminescent nanocrystals such as CdSe/ZnS, InP/ZnS, PbSe/PbS, CdSe/CdS, CdTe/CdS or CdTe/ZnS. Other examples of the quantum dot materials include halide perovskite quantum dots such as $CsPbX_3$, where X is Cl, Br, I or a combination thereof. All of these semiconductor quantum dots may also have appropriate shells or coatings for passivation and/or environmental protection.

The ratio of each of the individual phosphors and other luminescent materials in the phosphor composition may vary depending on the characteristics of the desired light output. The relative proportions of the individual phosphors and other luminescent materials in the various phosphor compositions may be adjusted such that when their emissions are blended and employed in a device, for example a lighting apparatus, there is produced visible light of predetermined x and y values on the CIE chromaticity diagram.

In one embodiment, the phosphor composition includes phosphors in particulate form with particle size diameter in the range from about 0.1 μm to about 15 μm. In another embodiment, the particle size diameter is in the range from about 0.1 μm to about 10 μm. In another embodiment, the particle size distribution that is, D50 of less than 15 μm, particularly, D50 of less than 10 μm, particularly D50 of less than 5 μm, or D50 of less than 3 μm, or D50 of less than 2 μm, or D50 of less than 1 μm. In another embodiment, the particle size distribution D50 may be in a range from about 0.1 μm to about 5 μm. In another embodiment, the D50 particle size is in a range from about 0.1 μm to about 3 μm. In another embodiment, the D50 particle size is in a range from about 0.1 μm to about 1 μm. In another embodiment, the D50 particle size is in a range from about 1 μm to about 5 μm. D50 (also expressed as $D_{50}$) is defined as the median particle size for a volume distribution. D90 or $D_{90}$ is the particle size for a volume distribution that is greater than the particle size of 90% of the particles of the distribution. D10 or $D_{10}$ is the particle size for a volume distribution that is greater than the particle size of 10% of the particles of the distribution. Particle size of the phosphors may be conveniently measured by laser diffraction or optical microscopy methods, and commercially available software can generate the particle size distribution and span. Span is a measure of the width of the particle size distribution curve for a particulate material or powder, and is defined according to the equation:

$$\text{Span} = \frac{(D_{90} - D_{10})}{D_{50}}$$

wherein $D_{90}$, $D_{10}$ and $D_{50}$ are defined above. For phosphor particles, span of the particle size distribution is not necessarily limited and may be ≤1.0 in some embodiments.

The phosphors may be ground or milled, in a conventional manner, into small particle sizes.

In another aspect, devices including a phosphor composition including an activated uranium-based phosphor and an LED light source radiationally connected and/or optically coupled to an activated uranium-based phosphor is provided. The activated uranium-based phosphor material is selected from:

(i) a phosphor having formula I:

$$[Ba_{1-a-b}Sr_aCa_b]_x[Mg,Zn]_y(UO_2)_z([P,V]O_4)_{2(x+y+z)/3} \quad (I)$$

where the phosphor is doped with $Eu^{3+}$, where $0 \leq a \leq 1$, $0 \leq b \leq 1$, $0.75 \leq x \leq 1.25$, $0.75 \leq y \leq 1.25$, and $0.75 \leq z \leq 1.25$; or (ii) a phosphor having formula II:

$$[Ba_{1-a-b}Sr_aCa_b]_p(UO_2)_q[P,V]_rO_{(2p+2q+5r)/2} \quad (II),$$

where the phosphor is doped with $Eu^{3+}$, where $0 \leq a \leq 1$, $0 \leq b \leq 1$, $0.75 \leq x \leq 1.25$, $0.75 \leq y \leq 1.25$, $0.75 \leq z \leq 1.25$, $2.5 \leq p \leq 3.5$, $1.75 \leq q \leq 2.25$, and $3.5 \leq r \leq 4.5$, and formula II excludes the combination where a is 0, b is 0, p is 3.5, q is 1.75, and r is 3.5.

Figure 1:
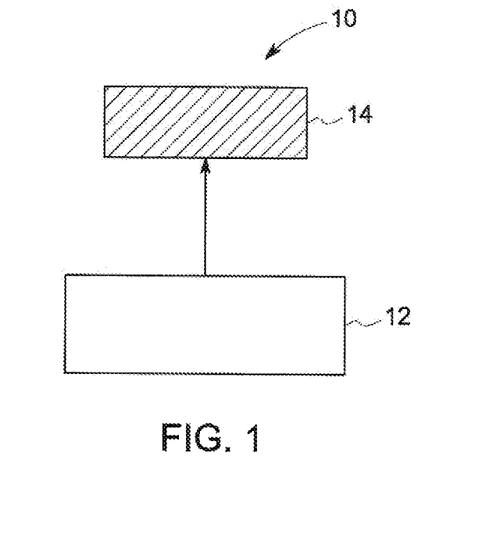
FIG. 1 is a schematic cross-sectional view of a device, in accordance with one embodiment of the disclosure.

Devices according to the present disclosure include an LED light source radiationally connected and/or optically coupled to one or more uranium-based phosphor materials, such as uranium-based phosphors having formulas I or II. FIG. 1 shows a device 10, according to one embodiment of the present disclosure. The device 10 includes a LED light source 12 and a phosphor composition 14 including an activated uranium-based phosphor material of the present disclosure. The LED light source 12 may be a UV or blue emitting LED. In some embodiments, the LED light source 12 produces blue light in a wavelength range from about 380 nm to about 460 nm. In the device 10, the phosphor composition 14 including the uranium-based phosphor material as described herein, is radiationally coupled and/or optically coupled to the LED light source 12. Radiationally connected or coupled or optically coupled means that radiation from the LED light source 12 is able to excite the phosphor composition 14, and the phosphor composition 14 is able to emit light in response to the excitation by the radiation. The phosphor composition 14 may be disposed on a part or portion of the LED light source 12 or located remotely at a distance from the LED light source 12. In some embodiments, the device may be a backlight unit for display applications.

The general discussion of the example LED light source discussed herein is directed toward an inorganic LED based light source. The most popular white LEDs are based on blue or UV emitting GaInN chips. In addition, to inorganic LED light sources, the term LED light source is meant to encompass all LED light sources such as semiconductor laser diodes (LD), organic light emitting diodes (OLED) or a hybrid of LED and LD. The LED light source may be a miniLED or microLED, which can be used in self-emissive displays. Further, it should be understood that the LED light source may be replaced, supplemented or augmented by another radiation source unless otherwise noted and that any reference to semiconductor, semiconductor LED, or LED chip is merely representative of any appropriate radiation source, including, but not limited to, LDs and OLEDs.

The phosphor composition 14 may be present in any form such as powder, glass, or composite e.g., phosphor-polymer composite or phosphor-glass composite. Further, the phosphor composition 14 may be used as a layer, sheet, film, strip, dispersed particulates, or a combination thereof. In some embodiments, the phosphor composition 14 includes the activated uranium-based phosphor material in glass form. In some of these embodiments, the device 10 may include the phosphor composition 14 in form of a phosphor wheel (not shown). The phosphor wheel may include the uranium-based phosphor material embedded in a glass. A phosphor wheel and related devices are described in WO 2017/196779.

The phosphor composition including the activated uranium-based phosphor material is optically coupled or radiationally connected to an LED light source. In one embodiment, a white light blend may be obtained by blending the activated uranium-based phosphor material and an additional luminescent material with an LED light source, such as a blue or UV LED. The pure uranium emission spectra of the phosphor materials have a narrow band emission in the green range close to the center of the eye sensitivity range. The phosphor material can absorb at 450 nm and can fill in the teal gap range of human centric lighting, which leads to a full spectra for general lighting and provide high CRI values. The pure uranium spectra can be used for display backlight applications to provide a high gamut display.

In one embodiment, the uranium-based phosphor material is doped with an activator ion providing an orange or red emission. In one embodiment, the uranium-based phosphor is doped with a Europium activator ion having a red emission that is spectrally close to the eye sensitivity range, which appears brighter to human vision. In one embodiment, a Europium-doped uranium-based phosphor is combined with a yellow-green or green emitting phosphor, such as an yttrium-aluminum garnet (YAG) phosphor, and a blue-emitting or UV-emitting LED to prepare a white blend with a high efficacy (lumens/Watt) value. In another embodiment, a composition includes an activated uranium-based phosphor and a red phosphor having formula VI.

Figure 2:
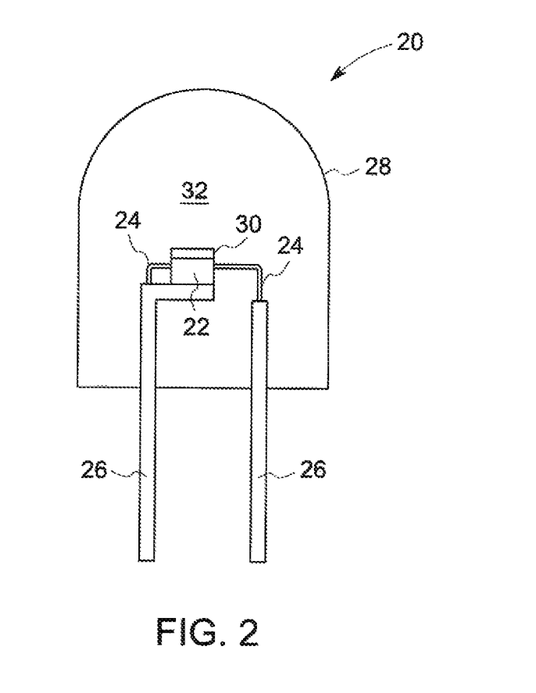
FIG. 2 is a schematic cross-sectional view of a lighting apparatus, in accordance with one embodiment of the disclosure.

FIG. 2 illustrates a lighting apparatus or lamp 20, in accordance with some embodiments. The lighting apparatus 20 includes an LED chip 22 and leads 24 electrically attached to the LED chip 22. The leads 24 may comprise thin wires supported by a thicker lead frame(s) 26 or the leads 24 may comprise self-supported electrodes and the lead frame may be omitted. The leads 24 provide current to LED chip 22 and thus cause it to emit radiation.

A layer 30 of a phosphor composition including the uranium-based phosphor material is disposed on a surface of the LED chip 22. The phosphor layer 30 may be disposed by any appropriate method, for example, using a slurry or ink composition prepared by mixing the phosphor composition and a binder material. In one such method, a silicone slurry in which the phosphor composition particles are randomly suspended or uniformly dispersed is placed around the LED chip 22. This method is merely exemplary of possible positions of the phosphor layer 30 and LED chip 22. The phosphor layer 30 may be coated over or directly on the light emitting surface of the LED chip 22 by coating and drying the slurry over the LED chip 22. The light emitted by the LED chip 22 mixes with the light emitted by the phosphor composition to produce desired emission.

Examples of binders include, but are not limited to ethyl cellulose, polystyrene, polyacrylate, polymethyl acrylate (PMA), polymethyl methacrylate (PMMA), polycarbonate, polyurethane, polyetherether ketone, polysulfone, polyphenylene sulfide, polyvinylpyrrolidone (PVP), polyethyleneimine (PEI), poly(l-naphthyl methacrylate), poly(vinyl phenyl sulfide) (PVPS), polyvinyl alcohol (PVA), polyvinyl butyral (PVB), poly(N-vinylphthalimide), polyvinylidene fluoride (PDVF), poly(vinylidene fluoride-co-hexafluoropropylene) (PVDF-HFP), silicone materials and UV-curable materials, such as epoxy resins, acrylic resins, acrylate resins and urethane-based materials.

With continued reference to FIG. 2, the LED chip 22 may be encapsulated within an envelope 28. The envelope 28 may be formed of, for example glass or plastic. The LED chip 22 may be enclosed by an encapsulant material 32. The encapsulant material 32 may be a low temperature glass, or a polymer or resin known in the art, for example, an epoxy, silicone, epoxy-silicone, acrylate or a combination thereof. In an alternative embodiment, the lighting apparatus 20 may only include the encapsulant material 32 without the envelope 28. Both the envelope 28 and the encapsulant material 32 should be transparent to allow light to be transmitted through those elements.

Figure 3:
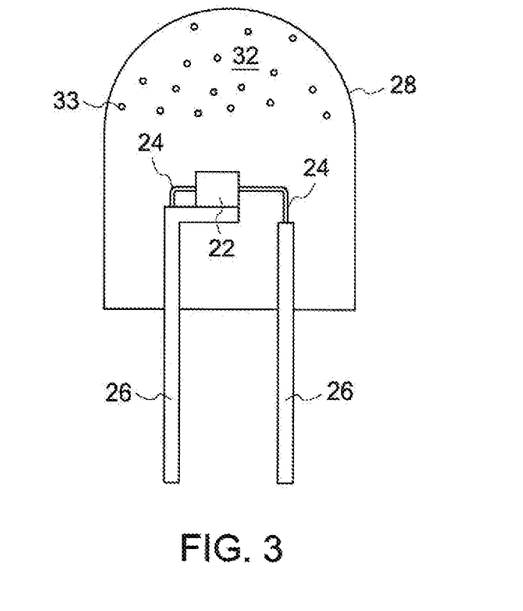
FIG. 3 is a schematic cross-sectional view of a lighting apparatus, in accordance with another embodiment of the disclosure.

In some embodiments as illustrated in FIG. 3, a phosphor composition 33 uranium-based phosphor material is interspersed within the encapsulant material 32, instead of being formed directly on the LED chip 22, as shown in FIG. 2. The phosphor composition 33 may be interspersed within a portion of the encapsulant material 32 or throughout the entire volume of the encapsulant material 32. Blue light or UV light emitted by the LED chip 22 mixes with the light emitted by phosphor composition 33, and the mixed light transmits out from the lighting apparatus 20.

Figure 4:
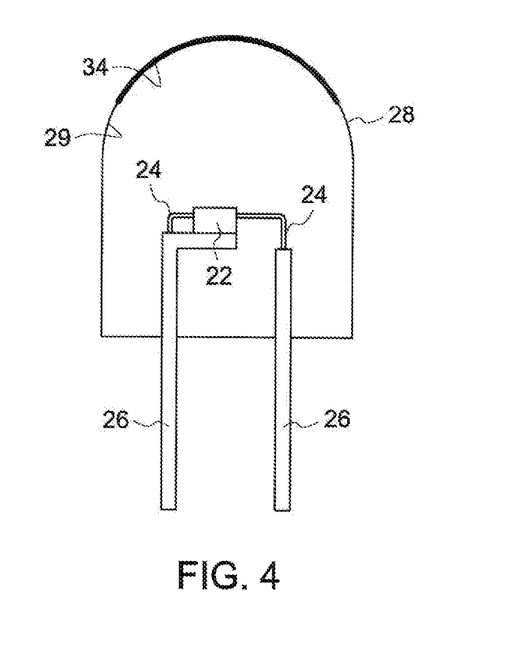
FIG. 4 is a cutaway side perspective view of a lighting apparatus, in accordance with one embodiment of the disclosure.

In yet another embodiment, a layer 34 of the phosphor composition including the activated uranium-based phosphor material, is coated onto a surface of the envelope 28, instead of being formed over the LED chip 22, as illustrated in FIG. 4. As shown, the phosphor layer 34 is coated on an inside surface 29 of the envelope 28, although the phosphor layer 34 may be coated on an outside surface of the envelope 28, if desired. The phosphor layer 34 may be coated on the entire surface of the envelope 28 or only a top portion of the inside surface 29 of the envelope 28. The UV/blue light emitted by the LED chip 22 mixes with the light emitted by the phosphor layer 34, and the mixed light transmits out. Of course, the phosphor composition may be located in any two or all three locations (as shown in FIGS. 2-4) or in any other suitable location, such as separately from the envelope 28, remote or integrated into the LED chip 22. In one embodiment, the phosphor layer 34 may be a film and located remotely from the LED chip 22. In another embodiment, the phosphor layer 34 may be a film and disposed on the LED chip 22. In some embodiments, the phosphor layer 34 may be applied to the LED chip 22 as an ink composition and dried to form a film on the LED chip 22. In some embodiments, the film may be a single layer or multi-layered. In some embodiments, the film is a multi-layered structure where each layer of the multi-layered structure includes at least one phosphor or quantum dot material.

In any of the above structures, the lighting apparatus 20 (FIGS. 2-4) may also include a plurality of scattering particles (not shown), which are embedded in the encapsulant material 32. The scattering particles may comprise, for example, alumina, silica, zirconia, or titania. The scattering particles effectively scatter the directional light emitted from the LED chip 22, preferably with a negligible amount of absorption.

Figure 5:
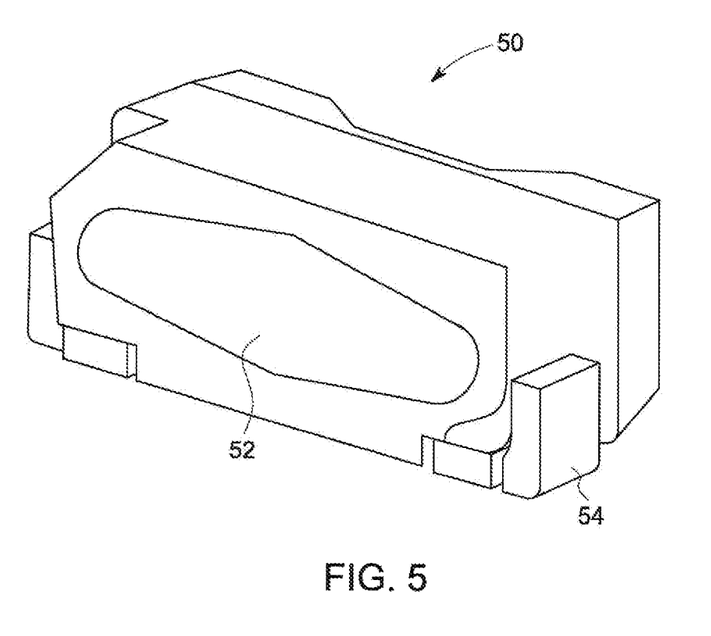
FIG. 5 is a schematic perspective view of a surface-mounted device (SMD), in accordance with one embodiment of the disclosure.

In one embodiment, the lighting apparatus 20 shown in FIG. 3 or FIG. 4 may be a backlight apparatus. In another embodiment, the backlight apparatus comprises a backlight unit 10. Some embodiments include a surface mounted device (SMD) type light emitting diode 50, e.g. as illustrated in FIG. 5, for backlight applications. This SMD is a "side-emitting type" and has a light-emitting window 52 on a protruding portion of a light guiding member 54. An SMD package may comprise an LED chip as defined above, and a phosphor composition including the green-emitting phosphor as described herein. In another embodiment, the device may be a direct lit display.

By use of the phosphor compositions described herein, devices can be provided producing white light for display applications, for example, LCD backlight units, having high color gamut and high luminosity. Alternately, devices can be provided producing white light for general illumination having high luminosity and high CRI values for a wide range of color temperatures of interest (2000 K to 10,000 K).

Devices of the present disclosure include lighting and display apparatuses for general illumination and display applications. Examples of display apparatuses include liquid crystal display (LCD) backlight units, televisions, computer monitors, vehicular displays, laptops, computer notebooks, mobile phones, smartphones, tablet computers and other handheld devices. Where the display is a backlight unit, the uranium-based phosphor materials may be incorporated in a film, sheet or strip that is radiationally coupled and/or optically coupled to the LED light source, as described in US Patent Application Publication No. 2017/0254943. Examples of other devices include chromatic lamps, plasma screens, xenon excitation lamps, UV excitation marking systems, automotive headlamps, home and theatre projectors, laser pumped devices, and point sensors. The list of these applications is meant to be merely exemplary and not exhaustive. In some embodiments, the displays may be eye-safe displays with reduced hazardous blue light emission.

In some embodiments, devices of the present disclosure include horticulture lighting. In one embodiment, horticulture lighting may include a device including an LED light source radiationally and/or optically coupled to a uranium-based phosphor having formula (I) or (II). In another embodiment, the device includes a uranium-based phosphor having formula (I) or (II) and a red phosphor having formula (VI). In another embodiment, the horticulture lighting includes a device including an activated uranium-based phosphor having formula (I) or (II), and a red phosphor having formula (VI), wherein the uranium-based phosphor is doped with an activator ion selected from the group consisting of $Eu^{3+}$. In another embodiment, a horticulture lighting includes a device including an activated uranium-based phosphor of (i) or (ii). In another embodiment, horticulture lighting includes a device having formula (I) or (II), and a red phosphor having formula (VI).

In another embodiment, horticulture lighting may include a phosphor package including activated uranium-based phosphors of sections (i) or (ii). In another embodiment, the horticulture lighting includes a composition including an activated uranium-based phosphor of sections (i) or (ii) and a red phosphor having formula (VI). In some embodiments, the phosphor package is a film or a sheet including dispersed activated uranium-based phosphors. In other embodiments, the phosphor package includes activated uranium-based phosphors dispersed within a medium or substrate. In some embodiments, the medium or substrate is transparent and may be used for solar plant lighting.

In some embodiments, very thin films including single phosphor materials may be disposed on small-size LEDs, such as micro-LEDs or mini-LEDs. In some embodiments, a film includes a red-emitting uranium-based phosphor material including a Europium activator ion. The uranium-based phosphor material strongly absorbs UV/blue emitting LED light and has shorter decay times. The uranium-based phosphor material is stable in water and can be easily ground or milled into small particle sizes for processing into films and maintain good quantum efficiency. Because the phosphor material has high absorption, minimal loading of the phosphor material can be used in the films, to create full conversion micro-LED displays or to be used in applications where the film thickness layer is crucial. In some embodiments, the uranium-based phosphor can emit both in the green and red, which is beneficial for preparing very thin single phosphor films having good Mura measurements. In some embodiments, the activated uranium-based phosphor material may be prepared into a film by ink jet printing, spin coating or slot die coating.

In other embodiments, the film includes phosphor particle sizes from about 0.1 µm to about 15 µm. In other embodiments, the film includes phosphor particle sizes from about 0.1 µm to about 10 µm. In another embodiment, the phosphor particles are no more than 5 microns. In another embodiment, the film includes phosphor particles sizes of from about 0.1 micron to about 5 microns. In another embodiment, the film includes particle sizes of from about 0.5 micron to about 5 microns. In another embodiment, the film includes particle sizes from about 0.1 micron to about 1 micron. In another embodiment, the film includes particle sizes from about 0.5 micron to about 1 micron. In another embodiment, the film includes particle sizes from about 1 micron to about 3 microns.

In some embodiments, the film may include scattering agents. In another embodiment, a brightness enhancement film, such as a double brightness enhancement film (DBEF) may be used in a lighting apparatus to enhance brightness to the viewer or plant, if used for horticulture lighting.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

EXAMPLES

Figure 6A:
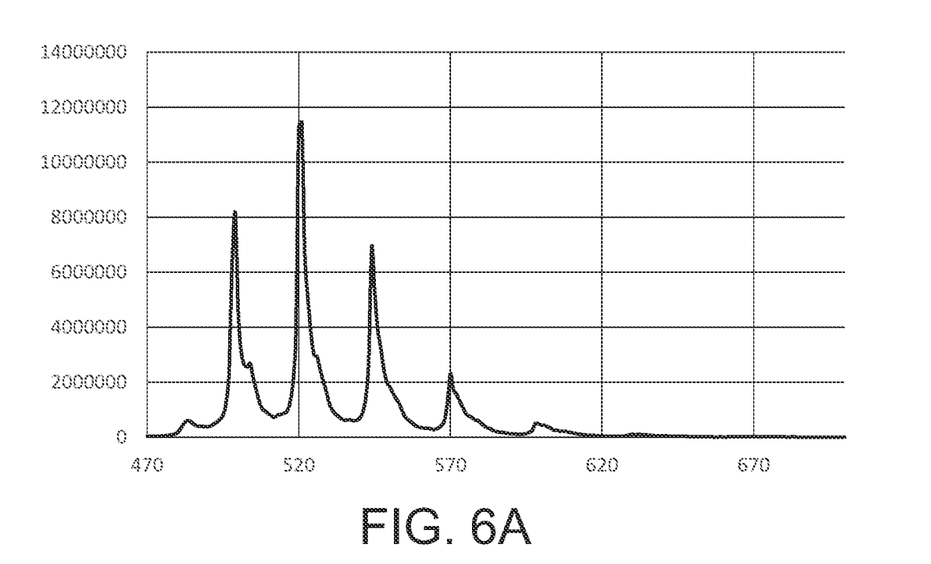
FIG. 6A is a spectra graph of emission wavelength (nm) vs. emission intensity for $Ba_3(PO_4)_2(UO_2)_2P_2O_7$.

Example 1: Preparation of $Ba_3(PO_4)_2(UO_2)_2P_2O_7$ Phosphor and Co-Doped $Ba_3(PO_4)_2(UO_2)_2P_2O_7$ Phosphor Material $BaHPO_4$, $BaCO_3$, $HUO_2PO_4 \cdot 4H_2O$ and DAP were weighed out in a mol ratio of 2:1:2:0.05 and then put in a Nalgene bottle with zirconia media and ball milled for two hours. After the mixture was thoroughly blended the powder was transferred into an alumina crucible and fired at 1100° C. for 5 hours. After firing, a yellow body-colored powder was obtained. The emission spectra of $Ba_3(PO_4)_2(UO_2)_2P_2O_7$ is shown in FIG. 6A. Results for $Ba_3(PO_4)_2(UO_2)_2P_2O_7$ is shown in Table 1 as Sample 1.

Figure 6B:
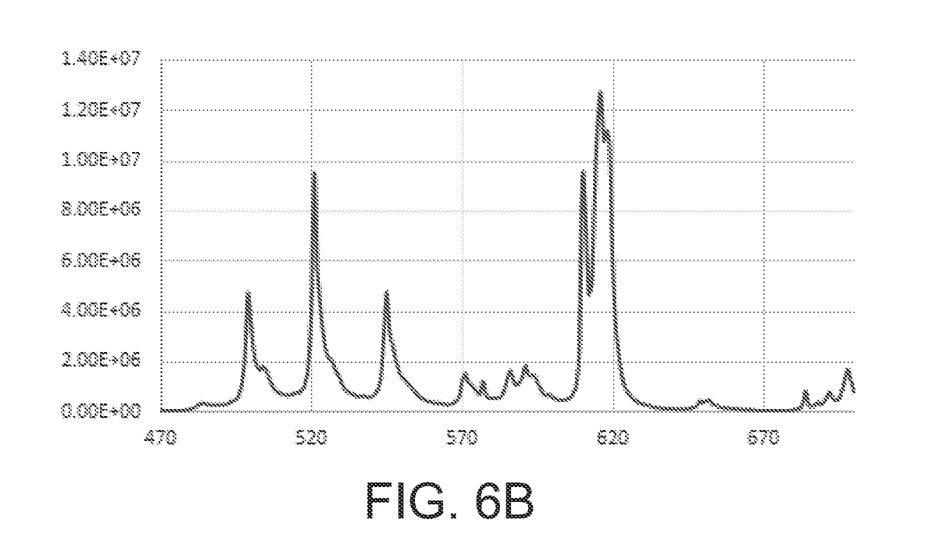
FIG. 6B is a spectra graph of emission wavelength (nm) vs. emission intensity for $Ba_3(PO_4)_2(UO_2)_2P_2O_7$ doped with $Eu^{3+}$.

For preparing $Ba_3(PO_4)_2(UO_2)_2P_2O_7$ doped with 1% molar amount of $Eu^{3+}$, the same procedure as above was used except 0.005 $Eu_2O_3$ was added and the amount for $BaCO_3$ was adjusted to 0.995. After firing, a yellow body colored powder was obtained. The emission spectra of $Ba_3(PO_4)_2(UO_2)_2P_2O_7$ doped with $Eu^{3+}$ is shown in FIG. 6B. Results for $Ba_3(PO_4)_2(UO_2)_2P_2O_7$ doped with $Eu^{3+}$ is shown in Table 1 as Sample 2.
Results are shown in Table 1.

TABLE 1

| Phosphor | Co-doped Ion (1 molar %) | QE | ccx | ccy |
|---|---|---|---|---|
| Sample 1 | None | 0.539 | 0.2225 | 0.6638 |
| Sample 2 | $Eu^{3+}$ | 0.378 | 0.4645 | 0.4900 |

Energy transfer is demonstrated by the difference in color coordinates ccx and ccy. Phosphor material $Ba_3(PO_4)_2(UO_2)_2P_2O_7$ doped with activator ions $Eu^{3+}$ shows that there is energy transfer from the uranium ion to the activator ions; although there is a drop in efficiency.

Figure 7A:
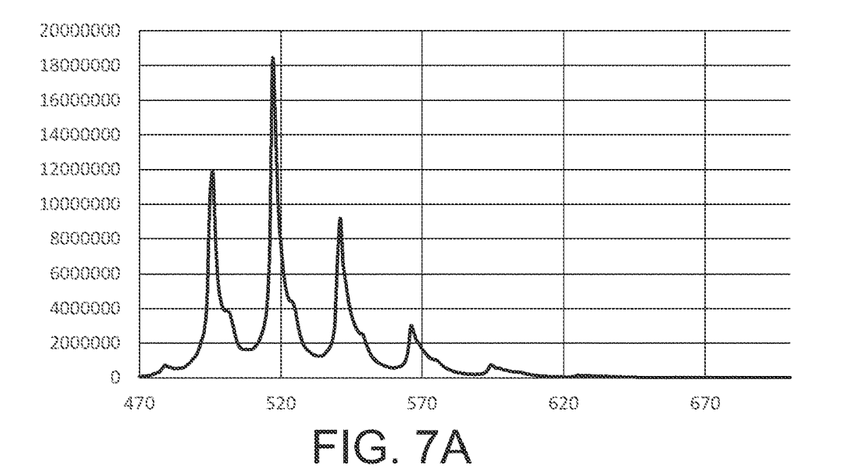
FIG. 7A is a spectra graph of emission wavelength (nm) vs. emission intensity for $BaZnUO_2(PO_4)_2$.

Example 2: Preparation of $BaZnUO_2(PO_4)_2$ Phosphor and Co-Doped $BaZnUO_2(PO_4)_2$ Phosphor Materials $BaHPO_4$, $HUO_2PO_4 \cdot 4H_2O$, ZnO and DAP were weighed out in a mol ratio of 1:1:1:0.05 and then put in a Nalgene bottle with zirconia media and ball milled for two hours. After the mixture was thoroughly blended the powder was transferred into an alumina crucible and fired at 1050° C. for 5 hours under flowing wet air. After firing, a yellow body-colored powder was obtained. The emission spectra of $BaZnUO_2(PO_4)_2$ is shown in FIG. 7A. Results of $BaZnUO_2(PO_4)_2$ is shown in Table 2 as Sample A.

Figure 7B:
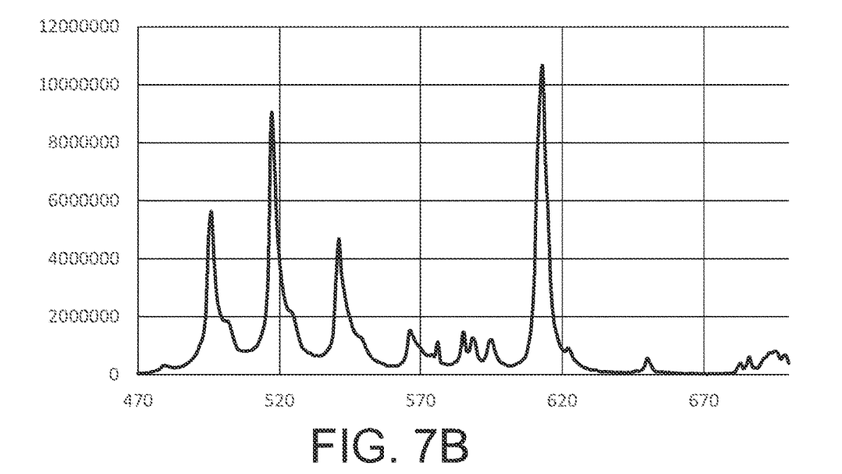
FIG. 7B is a spectra graph of emission wavelength (nm) vs. emission intensity for $BaZnUO_2(PO_4)_2$ doped with $Eu^{3+}$.

For preparing $BaZnUO_2(PO_4)_2$ doped with 1% molar amount of $Eu^{3+}$, the same procedure as above was used except 0.005 $Eu_2O_3$ was substituted for $BaHPO_4$. After firing a yellow body colored powder was obtained. The emission spectra of $BaZnUO_2(PO_4)_2$ doped with $Eu^{3+}$ is shown in FIG. 7B. Results of $BaZnUO_2(PO_4)_2$ doped with $Eu^{3+}$ is shown in Table 2 as Sample B.

$BaZnUO_2(PO_4)_2$ doped with 1% molar amount of $Ce^{3+}$ was prepared as for $BaZnUO_2(PO_4)_2$ doped with 1% molar amount of $Eu^{3+}$ except that $CeO_2$ was substituted for $Eu_2O_3$. Results of $BaZnUO_2(PO_4)_2$ doped with $Ce^{3+}$ is shown in Table 2 as Sample C.

$BaZnUO_2(PO_4)_2$ doped with 1% molar amount of $Mn^{2+}$ was prepared as for $BaZnUO_2(PO_4)_2$ doped with 1% molar amount of $Eu^{3+}$ except that $MnCO_3$ was substituted for $Eu_2O_3$. Results of $BaZnUO_2(PO_4)_2$ doped with $Mn^{2+}$ is shown in Table 2 as Sample D.

TABLE 2

| Phosphor | Co-doped Ion (1 molar %) | QE | ccx | ccy |
|---|---|---|---|---|
| Sample A | None | 0.86 | 0.1993 | 0.6571 |
| Sample B | $Eu^{3+}$ | 0.22 | 0.3738 | 0.5407 |
| Sample C | $Ce^{3+}$ | 0.31 | 0.2066 | 0.6577 |
| Sample D | $Mn^{2+}$ | | 0.2018 | 0.6564 |

Energy transfer is demonstrated by the difference in color coordinates ccx and ccy. Phosphor materials $BaZnUO_2(PO_4)_2$ doped with activator ion $Eu^{3+}$ shows that there is an energy transfer from the uranium ion to the activator ion. Phosphor materials $BaZnUO_2(PO_4)_2$ doped with activator ions $Ce^{3+}$ and $Mn^{2+}$ do not show a transfer of energy demonstrating that not all activator ions exhibit a transfer of energy with a uranium-based phosphor compound.

Example 3 Preparation of $BaZnUO_2(PO_4)_2$ and Co-Doped Phosphor Materials $BaZnUO_2(PO_4)_2$ was prepared as above for Sample A in Example 2.

Figure 8:
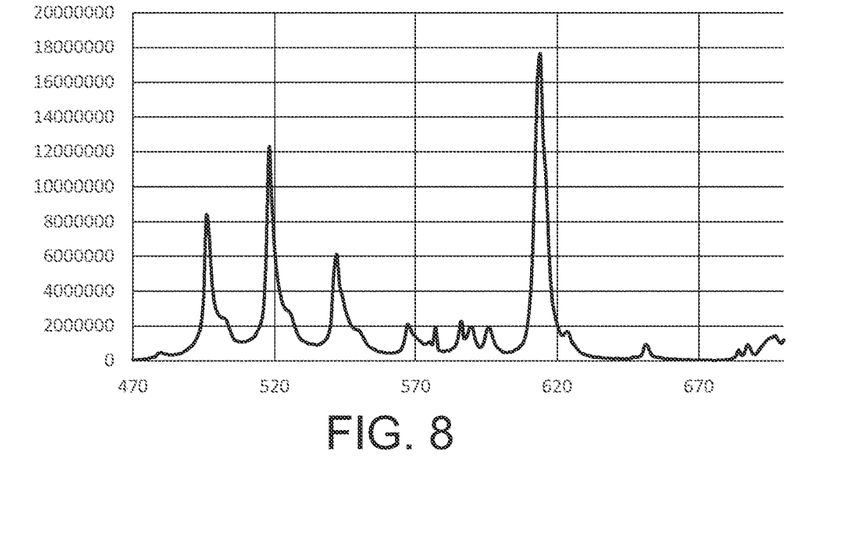
FIG. 8 is a spectra graph of emission wavelength (nm) vs. emission intensity for $BaZnUO_2(PO_4)_2$ doped with $Eu^{3+}$.

For preparing $BaZnUO_2(PO_4)_2$ doped with 1% molar amount of $Eu^{3+}$, $BaHPO_4$, $HUO_2PO_4 \cdot 4H_2O$, ZnO, DAP and $Eu_2O_3$ were weighed out in a mol ratio of 0.99:1:1:0.06:0.005 and then put in a Nalgene bottle with zirconia media and ball milled for two hours. After the mixture was thoroughly blended the powder was transferred into an alumina crucible and fired at 1050° C. for 5 hours under flowing wet air. After firing, a yellow body-colored powder was obtained. The emission spectra of BaZnUO$_2$(PO$_4$)$_2$ doped with Eu$^{3+}$ is shown in FIG. 8 and results are shown in Table 3.

TABLE 3

| Phosphor | Co-doped Ion (1 molar %) | QE | ccx | ccy |
|---|---|---|---|---|
| BaZnUO$_2$(PO$_4$)$_2$ | None | 0.86 | 0.1993 | 0.6571 |
| BaZnUO$_2$(PO$_4$)$_2$ | Eu$^{3+}$ | 0.27 | 0.4022 | 0.5229 |

Energy transfer is demonstrated by the difference in color coordinates ccx and ccy. Phosphor materials BaZnUO$_2$(PO$_4$)$_2$ co-doped with an activator ion show an energy transfer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A phosphor composition comprising an activated uranium-based phosphor having formula I or II:

$$[Ba_{1-a-b}Sr_aCa_b]_x[Mg,Zn]_y(UO_2)_z([P,V]O_4)_{2(x+z)/3} \quad (I)$$

$$[Ba_{1-a-b}Sr_aCa_b]_p(UO_2)_q[P,V]_rO_{(2p+2q+5r)/2} \quad (II),$$

wherein the phosphor is doped with Eu$^{3+}$, and
wherein 0≤a≤1, 0≤b≤1, 0.75≤x≤1.25, 0.75≤y≤1.25, 0.75≤z≤1.25, 2.5≤p≤3.5, 1.75≤q≤2.25, and 3.5≤r≤4.5, with the proviso that formula II excludes the combination of a is 0, b is 0, p is 3.5, q is 1.75, and r is 3.5.

2. The phosphor composition according to claim 1 further comprising at least one other luminescent material selected from the group consisting of: additional phosphors, phosphorescent dyes, color filter pigments, polyfluorenes, metal oxide nanoparticles, scattering particles and quantum dot material, and wherein the additional phosphors is selected from the group consisting of: [Ba,Sr,Ca]$_2$SiO$_4$:Eu$^{2+}$, [Y,Gd,Lu,Tb]$_3$[Al,Ga]$_5$O$_{12}$:Ce$^{3+}$, β-SiAlON:Eu$^{2+}$, [Sr,Ca,Ba][Ga,Al]$_2$S$_4$:Eu$^{2+}$, [Li,Ca]α-SiAlON:Eu$^{2+}$, [Ba,Sr,Ca]$_2$Si$_5$N$_8$:Eu$^{2+}$, [Ca,Sr]AlSiN$_3$:Eu$^{2+}$, [Ba,Sr,Ca]LiAl$_3$N$_4$:Eu$^{2+}$, [Sr,Ca,Mg]S:Eu$^{2+}$, and combinations thereof.

3. The phosphor composition according to claim 2, wherein the quantum dot material comprises perovskite quantum dots.

4. The phosphor composition according to claim 1 further comprising a red phosphor having formula VI:

$$A_x(MF_y):Mn^{4+} \quad VI$$

wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the MF$_y$ ion; and y is 5, 6 or 7.

5. The phosphor composition according to claim 4, wherein the red phosphor comprises:
K$_2$(TiF$_6$):Mn$^{4+}$, K$_2$(SnF$_6$):Mn$^{4+}$, Cs$_2$(TiF$_6$):Mn$^{4+}$, Rb$_2$(TiF$_6$):Mn$^{4+}$, Cs$_2$(SiF$_6$):Mn$^{4+}$, Rb$_2$(SiF$_6$):Mn$^{4+}$, Na$_2$(SiF$_6$):Mn$^{4+}$, Na$_2$(TiF$_6$):Mn$^{4+}$, Na$_2$(ZrF$_6$):Mn$^{4+}$, K$_3$(ZrF$_7$):Mn$^{4+}$, K$_3$(BiF$_7$):Mn$^{4+}$, K$_3$(YF$_7$):Mn$^{4+}$, K$_3$(LaF$_7$):Mn$^{4+}$, K$_3$(GdF$_7$):Mn$^{4+}$, K$_3$(NbF$_7$):Mn$^{4+}$ or K$_3$(TaF$_7$):Mn$^{4+}$.

6. The phosphor composition according to claim 4, wherein the red phosphor is K$_2$SiF$_6$:Mn$^{4+}$.

7. The phosphor composition according to claim 4, wherein the red phosphor is at least partially coated with a surface coating comprising a metal fluoride or a silica.

8. The phosphor composition according to claim 7, wherein the metal fluoride is selected from the group consisting of MgF$_2$, CaF$_2$, SrF$_2$, BaF$_2$, AgF, ZnF$_2$, AlF$_3$, and a combination thereof.

9. A device comprising an LED light source radiationally and/or optically coupled to the phosphor composition according to claim 1.

10. The device according to claim 9, wherein the LED light source is a mini LED or a micro LED.

11. The device according to claim 9, wherein the LED light source emits blue light or UV light.

12. A lighting apparatus comprising the device of claim 9.

13. A backlight apparatus comprising the device of claim 9.

14. A television comprising the backlight apparatus of claim 13.

15. A mobile phone comprising the backlight apparatus of claim 13.

16. A computer monitor comprising the backlight apparatus of claim 13.

17. A laptop comprising the backlight apparatus of claim 13.

18. A tablet computer comprising the backlight apparatus of claim 13.

19. An automotive display comprising the backlight apparatus of claim 13.

20. A horticulture lighting apparatus comprising the device of claim 9.

21. The phosphor composition according to claim 1, wherein the phosphor is selected from the group consisting of: Ba$_3$(PO$_4$)$_2$(UO$_2$)$_2$P$_2$O$_7$, BaZnUO$_2$(PO$_4$)$_2$, and BaMgUO$_2$(PO$_4$)$_2$.

22. The phosphor composition according to claim 1, wherein the phosphor has a D50 particle size from about 0.1 μm to about 15 μm.

23. The phosphor composition according to claim 4, wherein the activated uranium-based phosphor is selected from the group consisting of: Ba$_3$(PO$_4$)$_2$(UO$_2$)$_2$P$_2$O$_7$, BaZnUO$_2$(PO$_4$)$_2$, and BaMgUO$_2$(PO$_4$)$_2$.

24. The phosphor composition according to claim 4, wherein the activated uranium-based phosphor and the red phosphor have a D50 particle size from about 0.1 μm to about 15 μm.

25. The phosphor composition according to claim 4 further comprising at least one other luminescent material selected from the group consisting of: additional phosphors, phosphorescent dyes, color filter pigments, polyfluorenes, metal oxide nanoparticles, scattering particles and quantum dot material, and wherein the additional phosphors is selected from the group consisting of: [Ba,Sr,Ca]$_2$SiO$_4$:Eu$^{2+}$, [Y,Gd,Lu, Tb]$_3$[Al,Ga]$_5$O$_{12}$:Ce$^{3+}$, β-SiAlON:Eu$^{2+}$, [Sr,Ca,Ba][Ga,Al]$_2$S$_4$:Eu$^{2+}$, [Li,Ca]α-SiAlON:Eu$^{2+}$, [Ba,Sr, Ca]$_2$Si$_5$N$_8$:Eu$^{2+}$, [Ca,Sr] AlSiN$_3$: Eu$^{2+}$, [Ba,Sr,Ca]LiAl$_3$N$_4$:Eu$^{2+}$, [Sr,Ca,Mg] S:Eu$^{2+}$, and combinations thereof.

26. The phosphor composition according to claim 25, wherein the quantum dot material comprises perovskite quantum dots.

27. The device according to claim 9, wherein the LED light source comprises an LED chip on which the phosphor composition is deposited.

28. The device according to claim 27, wherein the phosphor composition is deposited on the LED chip in a form of an ink or slurry composition.

29. The device according to claim 27, wherein the phosphor composition is in a form of a film.

30. The device according to claim 29, wherein the film is a single layer or multilayered structure.

31. The device according to claim 30, wherein the phosphor composition further comprises quantum dot material and the film is a multilayered structure, wherein each layer of the multilayered structure comprises at least one phosphor or quantum dot material.

32. The device according to claim 9, wherein the phosphor composition is in a form of a film and is located remotely from the LED light source.

33. The device according to claim 31, wherein at least one layer comprises a red phosphor having formula VI:

$$A_x(MF_y):Mn^{4+} \quad \text{VI}$$

wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the MFy ion; and y is 5, 6 or 7.

* * * * *

UNITED STATES PATENT AND TRADEMARK OFFICE
CERTIFICATE OF CORRECTION

PATENT NO. : 12,195,655 B2  
APPLICATION NO. : 17/966638  
DATED : January 14, 2025  
INVENTOR(S) : Samuel Joseph Camardello et al.

Page 1 of 1

It is certified that error appears in the above-identified patent and that said Letters Patent is hereby corrected as shown below:

In the Claims

In Column 17 Line 32 (Claim 1), replace "$[Ba_{1-a-b}Sr_aCa_b]_x[Mg,Zn]_y(UO_2)_z([P,V]O_4)_{2(x+z)/3}$ (I)" with --$[Ba_{1-a-b}Sr_aCa_b]_x[Mg,Zn]_y(UO_2)_z([P,V]O_4)_{2(x+z)/3}$--.

In Column 18 Lines 62-63 (Claim 25), replace "$[Ba, Sr, Ca]_2Si5N_8:Eu^{2+}$" with --$[Ba, Sr, Ca]_2Si_5N_8:Eu^{2+}$--.

In Column 19 Line 21 (Claim 33), replace "Ax(MFy):Mn.sup.4+VI" with --$A_x(MF_y):Mn^{4+}$ VI--.

Signed and Sealed this  
First Day of April, 2025

Coke Morgan Stewart  
*Acting Director of the United States Patent and Trademark Office*